Figure 1:
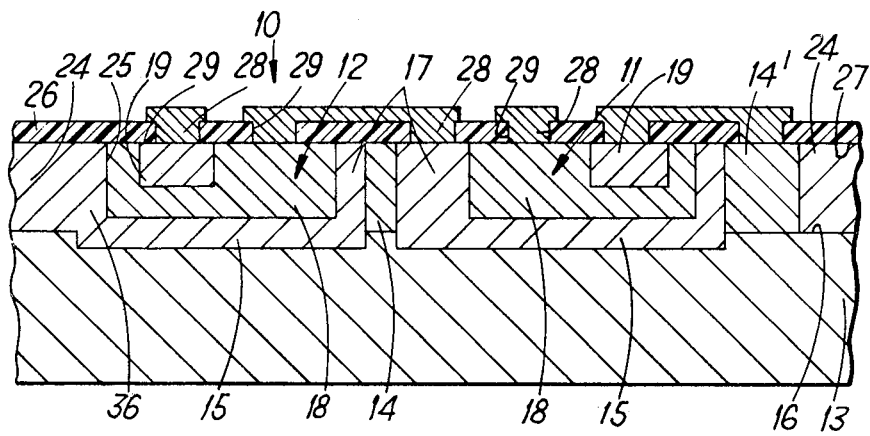

United States Patent [19]

Grundy et al.

[11] 4,053,336
[45] Oct. 11, 1977

[54] METHOD OF MANUFACTURING A SEMICONDUCTOR INTEGRATED CIRCUIT DEVICE HAVING A CONDUCTIVE PLANE AND A DIFFUSED NETWORK OF CONDUCTIVE TRACKS

[75] Inventors: David Latham Grundy, Grasscroft; Kenneth Lawson Hughes, Hale Barns, both of England

[73] Assignee: Ferranti Limited, Hollinwood, England

[21] Appl. No.: 634,277

[22] Filed: Nov. 21, 1975

Related U.S. Application Data

[60] Division of Ser. No. 542,674, Jan. 21, 1975, Pat. No. 3,945,032, which is a continuation of Ser. No. 359,597, May 11, 1973, abandoned.

[30] Foreign Application Priority Data

May 30, 1972 United Kingdom ............... 25168/72

[51] Int. Cl.$^2$ .................... H01L 21/20; H01L 21/22; H01L 21/70
[52] U.S. Cl. .................................. 148/175; 29/576 E; 29/577 R; 29/578; 148/187; 148/191; 357/40; 357/45; 357/46; 357/48; 357/50; 357/51
[58] Field of Search ......... 148/175, 187, 191; 357/40, 45, 46, 48, 51, 50; 29/576, 577, 578

[56] References Cited

U.S. PATENT DOCUMENTS

| 3,423,650 | 1/1969 | Cohen | 357/48 X |
| 3,443,176 | 5/1969 | Agusta et al. | 148/175 X |
| 3,560,277 | 2/1971 | Lloyd et al. | 148/175 |
| 3,575,741 | 4/1971 | Murphy | 148/175 |
| 3,590,342 | 6/1971 | Jekat | 357/48 X |
| 3,615,932 | 10/1971 | Makimoto et al. | 148/175 |
| 3,706,130 | 12/1972 | Seelbach | 357/48 X |
| 3,747,200 | 7/1973 | Rutledge | 29/577 X |
| 3,772,097 | 11/1973 | Davis | 148/175 |
| 3,865,648 | 2/1975 | Castrucci et al. | 148/75 |

OTHER PUBLICATIONS

"Integrated-Circuit Transistor Formation" from textbook by R. G. Hibberd; *Integrated Circuits*, McGraw-Hill, 1969, pp. 34–41.

*Primary Examiner*—L. Dewayne Rutledge
*Assistant Examiner*—W. G. Saba
*Attorney, Agent, or Firm*—Cameron, Kerkam, Sutton, Stowell & Stowell

[57] ABSTRACT

A semiconductor device having a plurality of constituent components within a semiconductor body such that the device in combination with one of a plurality of different possible metallization patterns of conductors forms a desired circuit arrangement, is provided in a semiconductor body having an epitaxial layer of one conductivity type on a substrate of the same conductivity type and suitable to be employed as a conductive plane, and is manufactured by a method which includes the diffusion step of providing simultaneously within the epitaxial layer regions of opposite conductivity type of the constituent components of the device and a network of conductive tracks, it being possible, for example, for the device to include bipolar transistors of the so-called collector-diffusion-isolation construction or isoplanar construction.

16 Claims, 5 Drawing Figures

4,053,336

METHOD OF MANUFACTURING A SEMICONDUCTOR INTEGRATED CIRCUIT DEVICE HAVING A CONDUCTIVE PLANE AND A DIFFUSED NETWORK OF CONDUCTIVE TRACKS

This is a division of application Ser. No. 542,674, filed Jan. 21, 1975 now U.S. Pat. No. 3,945,032, which is a continuation of application Ser. No. 359,597, filed May 11, 1973, and now abandoned.

This invention relates to semiconductor devices, each of which devices has a plurality of constituent components within a semiconductor body, such that the device in combination with one of a plurality of different possible metallisation patterns of conductors forms a desired circuit arrangement, whereby either faulty or redundant components of the device are omitted in forming the desired circuit arrangement and/or the desired circuit arrangement is the selected one of a corresponding plurality of different circuit arrangements which are capable of being provided by the combination of the semiconductor device and a possible metallisation pattern of conductors. The constituent components of the semiconductor device may comprise different, individual circuit elements, such as transistors and resistors, and/or aggregations of such different circuit elements. Components comprising aggregations of circuit elements possibly form functional units such as logic gates and flip-flops. Aggregations of circuit elements may require, at least partially, to be interconnected by a metallisation pattern to form the components, and thus an aggregation of circuit elements may be interconnected in one of a plurality of different possible ways in order to form one of a plurality of different possible components. Alternatively, or in addition, a component may comprise an aggregation of circuit elements, at least partially interconnected within the semiconductor body. Further, it is possible that one or more circuit elements of an aggregation of circuit elements may be selected and employed as a component in the circuit arrangement. Each such semiconductor device has a contact-bearing face covered with a layer of passivating material, contacts extending to the semiconductor body through apertures in the passivating layer. Subsequently, there is provided to extend between the contacts of the device a selected one of the different possible conductor patterns on the semiconductor device to form the desired circuit arrangement, the selected conductor pattern comprising a layer or layers of metallisation formed, respectively, on a layer or layers of passivating material on the contact-bearing face of the device. The metallisation pattern co-operates with, and interconnects in the desired manner, the device contacts. The metallisation pattern may be required to interconnect aggregations of circuit elements to complete components of the device, however, such aggregations of circuit elements will be referred to as components.

The components of the device are required to be connected to means to energise them and, where required, to means to supply signals to, and to receive signals from the components.

In particular the present invention relates to such a semiconductor device manufactured in a semiconductor body having an epitaxial layer of one conductivity type on a substrate of the same conductivity type.

It is an object of the present invention to provide a novel and advantageous method of manufacturing such a semiconductor device.

According to the present invention a method of manufacturing a semiconductor device having a plurality of constituent components such that the device in combination with one of a plurality of different possible metallisation patterns of conductors forms a desired circuit arrangement, includes providing a semiconductor body with an epitaxial layer of one conductivity type on a substrate of the same conductivity type to be employed as a conductive plane and diffusing impurity characteristic of the opposite conductivity type into the epitaxial layer to form simultaneously regions of the constituent components of the device and a network of conductive tracks.

The substrate of the semiconductor body may be employed as a conductive plane if it is sufficiently heavily doped, i.e. having a resistivity value of less than 0.5 ohm-cm., and preferably being of 0.1 ohm-cm., material.

The device may be provided with bipolar transistor circuit elements of the so-called collector-diffusion-isolation construction.

Alternatively, the device may be provided with bipolar transistor circuit elements of the so-called iso-planar construction.

Other circuit elements of the device may be provided with constructions, for example, closely resembling that of a collector-diffusion-isolation bipolar transistor, or an iso-planar bipolar transistor. The other circuit elements are provided simultaneously with the formation of the collector-diffusion-isolation or isoplanar bipolar transistors of the device, and, respectively, the device may be referred to as a collector-diffusion-isolation type device or an iso-planar type device.

Normally, the device components are provided, at least substantially, within the epitaxial layer of the semiconductor body, and device contacts are provided on the face of the epitaxial layer remote from the substrate.

According to another aspect the present invention comprises a semiconductor device having a plurality of constituent components such that the device in combination with one of a plurality of different possible metallisation patterns of conductors forms a desired circuit arrangement, comprises a semiconductor body with an epitaxial layer of one conductivity type on a substrate of the same conductivity type to be employed as a conductive plane, and includes a plurality of diffused regions of opposite conductivity type providing regions of the constituent components of the device and a diffused network of conductive tracks.

Figure 2:
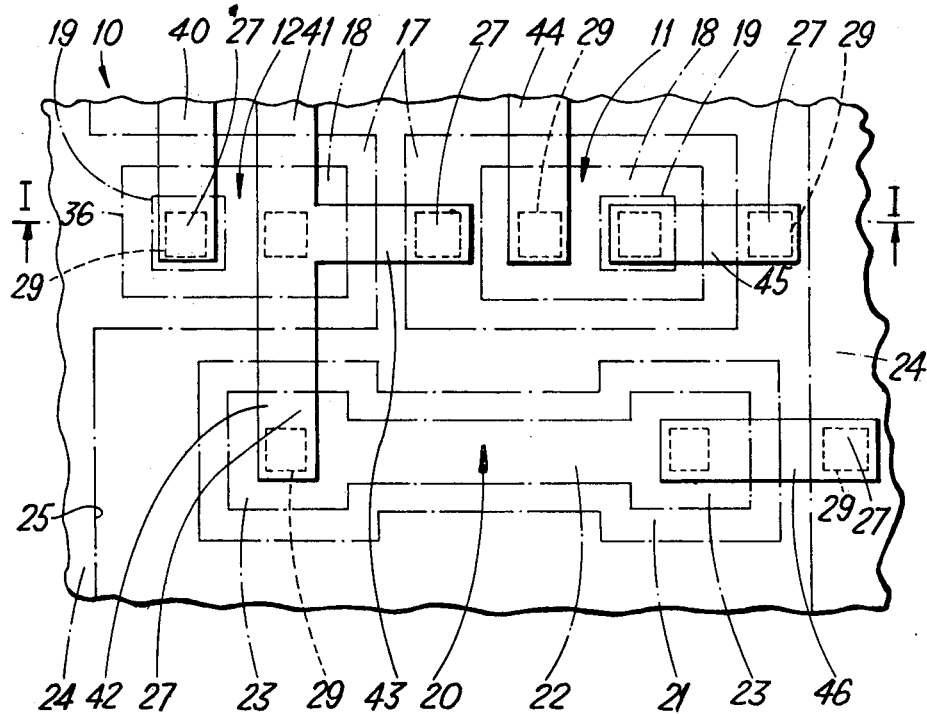
Figure 3:
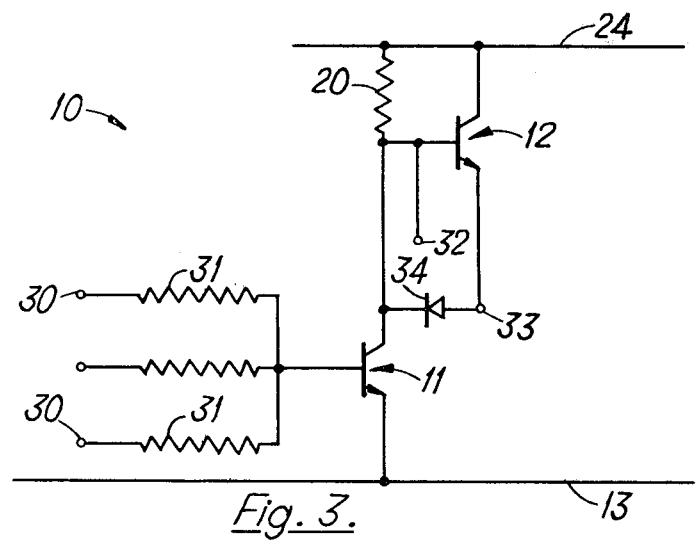
Figure 4:
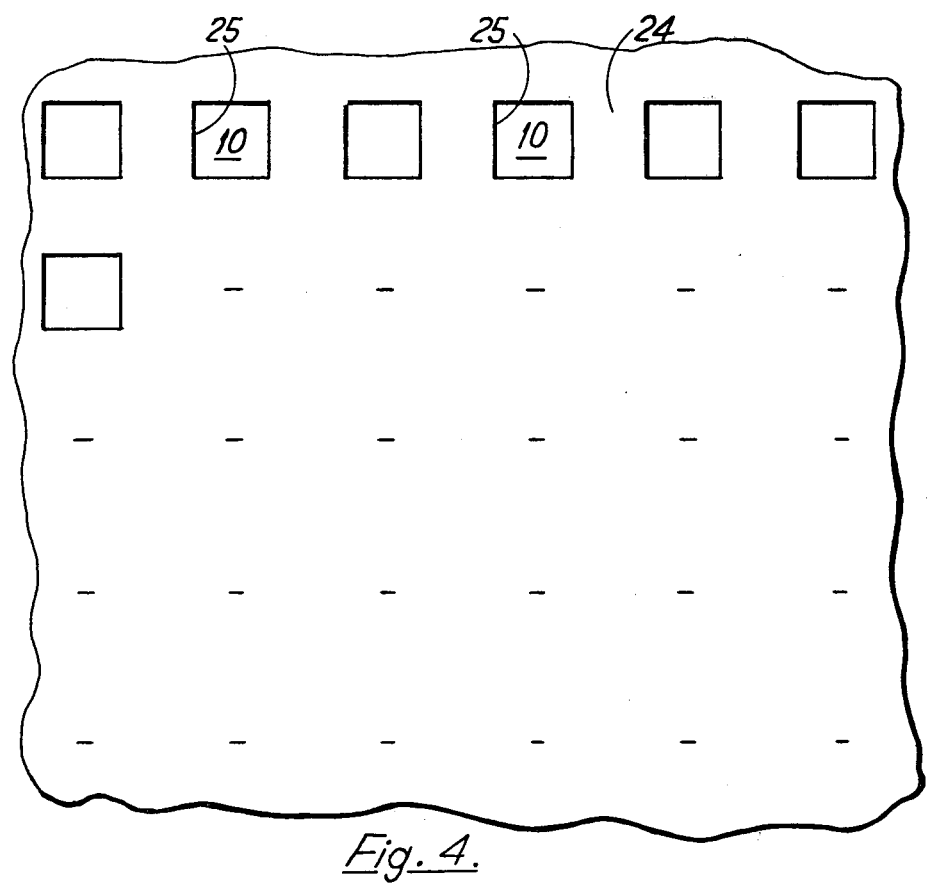
Figure 5:
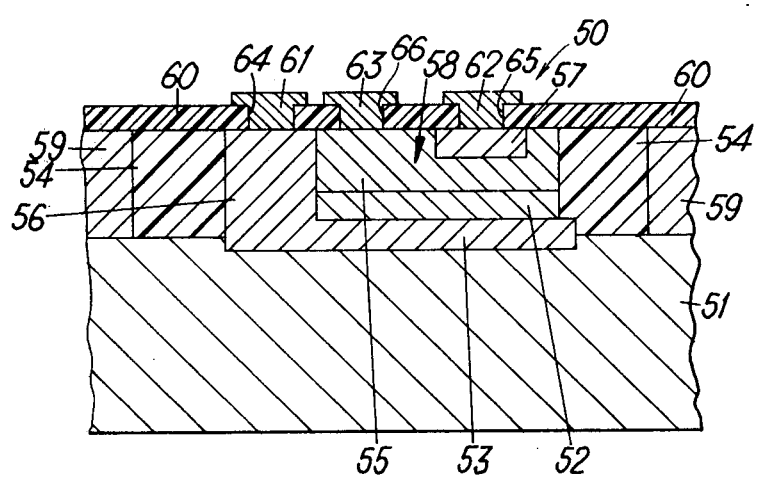

The present invention will now be described by way of example with reference to the accompanying drawings, in which, FIGS. 1 and 2 show part of a component of a semiconductor collector-diffusion-isolation type device according to one embodiment of the present invention. FIG. 1 comprising a section on the line I—I of FIG. 2, which is a fragmentary plan view of the component, FIG. 3 is a circuit diagram of a NOR gate in positive logic circuitry comprising the device component of FIGS. 1 and 2, FIG. 4 indicates diagrammatically part of the device having a regular rectangular array of identical components each component comprising the NOR gate of FIG. 3, and FIG. 5 is a section of an iso-planar bipolar transistor comprising part of another embodiment of a device according to the present invention.

FIGS. 1 and 2 show part of a component 10 of a semiconductor device having a plurality of constituent components within a semiconductor body, such that the device in combination with one of a plurality of different possible metallisation patterns of conductors forms a desired circuit arrangement, the component 10 comprising a functional unit in the form of a logic gating circuit. The circuit diagram of the gating circuit, which is a NOR gate in positive logic circuitry, is shown in FIG. 3. The semiconductor device comprises, partially, a regular rectangular array of the components 10, as shown in FIG. 4.

Each component 10 of the semiconductor device includes two bipolar transistor circuit elements, 11 and 12, the transistors having the so-called collector-diffusion-isolation construction. Thus, the silicon semiconductor body in which the device is formed comprises a P type substrate 13 and a P type epitaxial layer 14. Buried heavily doped N+ type layers 15 are provided within the semiconductor body at the interface 16 between the substrate 13 and the epitaxial layer 14, the buried layers 15 being arranged to comprise part of the collectors of the transistors 11 and 12. In order to complete the collectors, isolation barriers 17 are diffused through the epitaxial layer 14 to contact the buried layers 15, each combination of a buried layer 15 and an isolation barrier 17 defining a P type base 18 in the epitaxial layer. N+ emitters 19 are then diffused into the bases 18. The surface portion of the epitaxial layer remote from the substrate is of P+ type being formed by a non-selective diffusion step before the provision of the emitters, for convenience, the P+ type surface portion not being shown.

In FIG. 2, for the sake of clarity, the buried layers are not indicated and P-N junctions are shown as chain-dotted lines Other circuit elements of the device, for example, comprising resistors or P-N junction field-effect transistors, are formed simultaneously with the transistors 11 and 12, and have a construction closely resembling that of the transistors. One such resistor 20 is shown in FIG. 2, and comprises an N+ type isolation barrier 21 and a co-operating N+ buried layer not shown, defining a P type resistor region 22 of the epitaxial layer. The resistor region 22 has enlarged end portions 23 to facilitate the provision of contacts to the resistor. Hence, all the components of the device are formed simultaneously with each other, and the device may be considered to be of the collector-diffusion-isolation type.

Simultaneously with the formation of the isolation barriers 17 and 21, and according to the present invention, there is diffused into the P-type epitaxial layer 14 of the semiconductor body an N+ type network of conductive tracks 24.

As is shown in FIG. 4, the networks 24 comprises a matrix of intersecting orthogonally-arranged conductive tracks and each component 10 of the device is formed in a region of the epitaxial layer 14 defined by the matrix. Thus, the conductive tracks 24 have the form of an apertured sheet at the surface of the epitaxial layer, the components 10 being formed in a regular, rectangular array of apertures 25 in the sheet.

During the formation of the diffused regions of the device, or subsequently thereto, a passivating layer 26 of silicon oxide is provided on the otherwise exposed face 27 of the epitaxial layer 14, as shown in FIG. 1. Contacts 28 to the semiconductor body are provided within apertures 29 extending through the passivating layer 26. In FIG. 2, the passivating layer 26 is not shown, although the apertures 29 through this layer are indicated by broken lines.

The P type substrate 13 of the semiconductor body comprises a conductive plane, and a connection is made to this plane, from the contact-bearing face 27, merely by providing a contact 28 to a P type region 14 of the epitaxial layer contiguous with the substrate. Thus, a conductive plane is provided in the device without modification of the semiconductor body being required.

The provision of the non-selective P+ type portion (not shown) of the epitaxial layer may be omitted, but this portion helps to stabilise any resistor of the semiconductor device, helps to prevent surface inversion and causes the gain bandwidth product of the bipolar transistor to be increased.

The fabrication of the semiconductor device in the semiconductor body is facilitated by the collector-diffusion-isolation bipolar transistor and the other circuit elements have substantially the same construction as each other. However, each other circuit element to be included in the semiconductor body, conveniently, may have any suitable construction.

The provision of the semiconductor device is facilitated by employing a bipolar transistor of the collector-diffusion-isolation construction, because such a transistor may occupy a smaller part of the contact-bearing surface of the semiconductor body in which the semiconductor device is formed, and requires fewer processing steps in its fabrication than most other known forms of bipolar transistor, so that manufacturing yields are greater.

The component 10, as shown in the circuit diagram of FIG. 3, comprises a NOR gate requiring a minimum number of electrical connections. The gating circuit comprises an input transistor 11, the collector of which is connected via the resistor 20 to a supply rail comprising the diffused network of conductive tracks 24. The emitter is connected directly to an earth return rail comprising the substrate conductive plane 13. The collector of the input transistor 11 is also connected to the base of an output transistor 12, and the collector of the output transistor is connected directly to the supply rail 24. The NOR gate has a plurality of input terminals 30 each connected individually via a resistor 31 (shown only in FIG. 3), to the base of the input transistor 11. Output terminals 32 and 33, respectively, are connected to the base and the emitter of the output transistor 12, and a diode 34 is connected between the output terminal 33 and the collector of the input transistor 11.

The NOR gate 10 also has a predetermined diffused conductive track 36 between the collector of the output transistor 12 and the network of diffused conductive tracks 24.

Each NOR gate 10, and any other type of component provided in the semiconductor device, are required to be interconnected to form a desired circuit arrangement. The required electrical interconnections to and between the components, the electrical interconnections required to complete each NOR gate 10, are required to be metal conductors, and contacts 28 throughout the device are all formed from an initially-continuous aluminium metallisation layer deposited on the passivating layer 26. From the metallisation layer is formed a selected conductor pattern co-operating with the contacts 28, the metallisation layer and the device forming the desired circuit arrangement. Only one metallisation layer is required.

The provision of the diffused network of conductive tracks ensures that the metallisation pattern of conductors is simpler than would otherwise be required to provide the desired circuit arrangement. The use of the substrate of the semiconductor body as a conductive plane also ensures that the metallisation pattern is simpler.

In addition, the network of conductive tracks is formed without any modification of the semiconductor body merely in order to provide the network. Further, it is formed simultaneously with all the components of the device, so as to have a required low sheet resistivity value suitable for conductive tracks. Hence, the network is of an advantageous form and is wholly compatible with a collector-diffusion-isolation type of device.

There are a plurality of different possible metallisation patterns of conductors, and one is selected so that either faulty or redundant components of the device are omitted in forming the desired circuit arrangement and/or the desired circuit arrangement is the selected one of a corresponding plurality of different circuit arrangements which are capable of being provided by the combination of the semiconductor device and a possible metallisation pattern of conductors.

In relation to the part of the component 10 shown in FIG. 2, the illustrated part of the aluminium conductor pattern, and the contacts 28 are indicated in continuous line form. The NOR gate is completed by the appropriate part of the metallisation layer comprising a conductor 40 between the emitter of the output transistor 12 and the output terminal 33, a conductor 41 between the base of the output transistor and the output terminal 32, a conductor 42 between this base and one end 23 of the resistor 20, a conductor 43 between this base and the collector of the input transistor, a conductor 44 between the base of the input transistor and the resistor 31, a conductor 45 between the emitter of the input transistor and a contact to the earthed substrate plane 13, and a conductor 46 between the other end 23 of the resistor 20 and the diffused network of conductive tracks 24.

Thus, each component 10 of the device is energised by connecting a source of electrical energy to the network of conductive tracks 24. The substrate of the semiconductor body is earthed, and so comprises the return rail for the means to energise the components. The diffused network of conductive tracks adjacent to the contact bearing face of the device has a low sheet resistivity value suitable for supplying electrical energy directly to the components. The substrate conveniently may be employed as a conductive plane because the substrate and the epitaxial layer are of the same conductivity type as each other. Thus, an electrical connection to the substrate requires only a contact on the contact bearing face of the device to a region of said one conductivity of the epitaxial layer and contiguous with the substrate, and no modification is required to the semiconductor body merely in order to provide the conductive plane.

The electrical interconnections to and between the components of the device comprise the remaining conductors (not shown) of the selected conductor pattern of the metallisation layer. By some of these remaining conductors means to supply signals to, and to receive signals from, the components, where required, are connected to the components, such means being connected to the input and output terminals of the components. Usually, all the remaining conductors of the selected pattern extend on the passivating layer over the diffused network of conductive tracks. Where the remaining conductors extend on the passivating layer on a component, they are arranged to extend over the central portions of the resistors and not over the P-N junctions of the transistors. In FIG. 4, showing the arrangement of the components and the network of conductive tracks, the passivating layer and the metallisation pattern of conductors are omitted.

The device may have more than one type of component. Thee components may be as the NOR gate described above, and comprise an aggregation of circuit elements and possibly be connected together to form functional units such as logic gates or flip-flops. An aggregation of circuit elements may be wholly interconnected together, and to the diffused network, of conductive tracks, by the metallisation pattern of conductors, or wholly by predetermined diffused conductive tracks within the semiconductor body. Alternatively, as described above, and shown in FIGS. 1 and 2, the components may be formed by interconnecting an aggregation of circuit elements partially by the metallisation pattern of conductors and partially by predetermined diffused conductive tracks. In the embodiment described above a predetermined diffused conductive track connects a transistor to the network of diffused conductive tracks. An aggregation of circuit elements may be interconnected in one of a plurality of different possible ways to form one of a plurality of different possible components.

A component may comprise one or more circuit elements. Further, a circuit element or elements of an aggregation of circuit elements may be selected and employed as a component of the device. A particular circuit element, such as a resistor, may be employed more than once in the desired circuit arrangement.

Resistor circuit elements may have the form of thin resistive films on the passivating layer.

One particular embodiment of a device according to the present invention is 0.14 inch square and has approximately 200 NOR gates and 8 flip-flops. The resistivity of the substrate of the semiconductor body is 0.1 ohm-cm., and the sheet resistivity of the diffused network of conductive tracks is 5.0 ohms per square. An electrical energy source having a potential of +5 volts is to be connected to the network of conductive tracks. An earth connection, to the substrate, has a resistance of approximately 30 ohms, which is acceptable when the electrical supply voltage is approximately 5 volts. Hence, the device may be employed, without interfacing, with conventional T.T.L. devices. The resistivity value of the substrate is smaller than is usual for collector-diffusion-isolation type devices, but the speed-power product associated with the device is satisfactory. Further, the consequent larger collector-substrate capacitance within the device, because of the lower resistivity substrate, is not such that the performance of the device is significantly adversely affected.

Although in the arrangement described above there is provided only one layer of metallisation, which is advantageous, more than one metallisation layer each on a different passivation layer may be provided if required. Such a plurality of different layers of metallisation comprises the desired metallisation pattern of conductors.

Another embodiment of a semiconductor device according to the present invention is an iso-planar type device, including bipolar transistors of the so-called iso-planar construction, and other circuit elements of constructions closely resembling that of an iso-planar bipolar transistor. An iso-planar bipolar transistor 50 is shown in FIG. 5, and is manufactured in a semiconductor body comprising a substrate 51 of P-conductivity type and an initially-continuous P-type epitaxial layer 52. A burried N+ type region 53 is provided at the part of the interface between the epitaxial layer 52 and substrate 51 where the transistor 50 is to be provided. The part of the epitaxial layer around where the transistor 50 is to be provided is etched to form a shallow depression, and this part of the epitaxial layer is then oxidised to form an insulating barrier 54 with a surface co-planar with the remainder of the epitaxial layer. The surface portion 55 of the epitaxial layer within the insulating barrier 54 is heavily doped with boron to become P+ type. An N+ type collector contact region 56 is then formed by diffusion of phosphorus through the epitaxial layer, so that it contacts the buried N+ type region 53 comprising the collector. Subsequently an N+ type emitter 57 is formed in the P+ type surface portion 55, by diffusing phosphorus into the semiconductor body. Phosphorus is also diffused into the surface portion of the collector contact region 56. The remainder of the P type epitaxial layer within the insulating barrier comprises the base 58 of the transistor.

Simultaneously with the formation of the N+ type regions 56 and 57, and according to the present invention, there is diffused into the P type epitaxial layer of the semiconductor body an N+ type network of conductive tracks, indicated partially at 59.

A diffusion-resistant layer 60 of silicon oxide is provided on the surface of the semiconductor body for use in the selective diffusion steps referred to above. The silicon oxide layer 60 becomes doped with phosphorus and is left on the semiconductor body for passivation purposes.

The transistor 50 is completed by providing contacts 61, 62 and 63, respectively, to the collector-contact region 56, the emitter 57 and the base 58. The contacts 61, 62 and 63 extend through apertures, respectively, 64, 65 and 66 in the silicon oxide layer 60. The contacts are etched from an initially-continuous metal layer on the silicon oxide layer and within the apertures 64, 65 and 66.

The P type substrate 51 of the semiconductor body comprises a conductive plane, and a connection is made to this plane merely by providing a contact (not shown) to a P type region of the epitaxial layer contiguous with the substrate.

The provision of the diffused network of conductive tracks is formed without any modification of the semiconductor body merely in order to provide the network. The use of the substrate of the semiconductor body as a conductive plane is possible because the substrate is sufficiently heavily doped, i.e. having a resistivity value of less than 0.5 ohm-cm., and preferably being of 0.1 ohm-cm. material.

A semiconductor device according to the present invention may be provided in any semiconductor body having an epitaxial layer of one conductivity type on a substrate of the same conductivity type and suitable to be employed as a conductive plane. Further, the diffused network of conductive tracks of the opposite conductivity type are provided simultaneously with diffused regions of the constituent components of the device of the opposite conductivity type and of a resistivity value suitable for conductive tracks.

What we claim is:

1. A method of manufacturing a semiconductor device having a plurality of constituent components and a plurality of different possible metallisation patterns of conductors for interconnecting said components in a desired functional circuit arrangement, includes providing a semiconductor body with a substrate of one conductivity type forming a conductive plane in the device, and an epitaxial layer on the substrate of the same conductivity type, forming a plurality of diffused regions of opposite conductivity type in the epitaxial layer, a plurality of said diffused regions of opposite conductivity type and a plurality of unmodified regions of the epitaxial layer forming the constituent components of the device, simultaneously with forming said plurality of diffused regions of opposite conductivity type forming in the epitaxial layer a diffused network of conductive tracks of said opposite conductivity type remote from the conductive plane, forming at least one metallisation pattern of conductors of said plurality of different possible metallisation patterns of conductors on said epitaxial layer and connecting the conductive plane via at least one unmodified region of the epitaxial layer and to the components and the conductive tracks to form the desired functional circuit arrangement.

2. A method as claimed in claim 1 wherein said constituent components include bipolar transistor circuit elements of collector-diffusion-isolation construction.

3. A method as claimed in claim 1 wherein said constituent components include bipolar transistor circuit elements of isoplanar construction.

4. A method as claimed in claim 1 in which the network of conductive tracks comprise a matrix of intersecting conductive tracks, the components of the device being provided within the regions of the epitaxial layer of the semiconductor body between the intersecting conductive tracks.

5. A method of manufacturing a semiconductor device includes providing a semiconductor body with a substrate of one conductivity type forming a conductive plane and an epitaxial layer of the same conductivity type on said substrate, forming in said layer a first plurality of unmodified regions and a second plurality of unmodified regions of said one conductivity type extending through the epitaxial layer and being contiguous with the substrate, forming spaced heavily doped regions of opposite conductivity type at the interface between the substrate and the epitaxial layer, a plurality of diffused regions of opposing conductivity type within said semiconductor body and a diffused network of conductive tracks adjacent to the surface of the epitaxial layer remote from the conductive plane, said doped layers, said first plurality of unmodified regions and said plurality of diffused regions being formed so as to provide a plurality of isolated components and a metallisation pattern of conductors on said epitaxial layer connecting said components, conductive tracks and, via said second plurality of unmodified regions, the conductive plane in a functional circuit arrangement.

6. A method of manufacturing a semiconductor device includes providing a semiconductor body with a substrate of one conductivity type forming a conductive plane and an epitaxial layer on said substrate of the same conductivity type forming a plurality of spaced heavily doped layers of opposite conductivity type at a portion of the interface between the substrate and the epitaxial layer, providing in said epitaxial layer a first plurality of unmodified regions of said one conductivity type contiguous with the conductive plane and extending through the epitaxial layer, at least one second unmodified region also of said one conductivity type and a plurality of diffused regions of said opposite conductivity type, forming adjacent to the surface of the epitaxial layer remote from the conductive plane a diffused network of conductive tracks of said opposite conductivity type, said plurality of heavily doped layers, said first plurality of unmodified regions and said plurality of diffused regions forming at least partially a plurality of components isolated from each other within the semiconductor body, and providing a metallisation pattern of conductors on said epitaxial layer connecting in a functional circuit arrangement said components, conductive tracks and, via said unmodified region, the conductive plane.

7. A method as claimed in claim 6 in which the network of conductive tracks comprises a matrix of intersecting conductive tracks, the components of the device being provided within the regions of the epitaxial layer of the semiconductor body between the intersecting conductive tracks.

8. A method as claimed in claim 6 wherein said constituent components include bipolar transistor circuit elements of collector-diffusion-isolation construction.

9. A method as claimed in claim 6 wherein said constituent components include transistor circuit elements of isoplanar construction.

10. A method of manufacturing a semiconductor device having a plurality of constituent components includes providing a semiconductor body with a substrate of one conductivity type forming a conductive plane in the device, and an epitaxial layer of the same conductivity type on the substrate, forming a plurality of diffused regions of opposite conductivity type in the epitaxial layer, a plurality of said diffused regions of opposite conductivity type and a plurality of unmodified regions of the epitaxial layer forming the constituent components of the device, simultaneously with forming said plurality of diffused regions of opposite conductivity type forming in the epitaxial layer a diffused network of conductive tracks of said opposite conductivity type, and forming one metallisation pattern of conductors of a plurality of different possible metallisation patterns of conductors, said provided metallisation pattern of conductors being disposed on said epitaxial layer and being connected to the conductive plane via at least one unmodified region of the epitaxial layer and to the components and the conductive tracks to form the desired functional circuit arrangement.

11. A method as claimed in claim 10 wherein the step of forming diffused regions includes forming a buried layer of said opposite conductivity type for at least one of the constituent components.

12. A method as claimed in claim 11 wherein the constituent components include bipolar transistors of collector-diffusion-isolation construction.

13. A method as claimed in claim 10 wherein at least one of the diffused network of conductors is formed contiguous with a diffused region of said opposite conductivity type.

14. A method as claimed in claim 10 wherein the diffused network of conductive tracks forms a matrix, and the components being provided in the islands so formed.

15. A method as claimed in claim 14 wherein the connections to the substrate are provided within the islands defined by the diffused conductor matrix.

16. A method as claimed in claim 11 wherein the constituent components include bipolar transistor circuit elements of isoplanar construction.

* * * * *